United States Patent [19]
Takuma et al.

[11] Patent Number: 5,945,503
[45] Date of Patent: Aug. 31, 1999

[54] POLYMALEIMIDE RESIN COMPOSITION AND LAMINATE PLATE FOR SEMICONDUCTOR SUBSTRATE USING IT

[75] Inventors: Keisuke Takuma; Takuo Tajima; Yoshiyuki Shindo; Koutaro Suzuki; Tatsuhiro Urakami; Atsuo Otsuji; Kouzou Tanaka, all of Kanagawa, Japan

[73] Assignee: Mitsui Chemicals, Inc., Tokyo, Japan

[21] Appl. No.: 08/966,802

[22] Filed: Nov. 10, 1997

[51] Int. Cl.⁶ .................................................. C08G 73/00
[52] U.S. Cl. ........................ 528/170; 528/321; 528/322
[58] Field of Search ..................... 524/255; 528/170, 528/321, 322

[56] References Cited

U.S. PATENT DOCUMENTS

| | | | |
|---|---|---|---|
| 4,661,553 | 4/1987 | Hefner | 528/170 |
| 4,680,378 | 7/1987 | Hefner | 528/322 |
| 4,966,961 | 10/1990 | Tanabe | 528/312 |
| 5,104,962 | 4/1992 | Yamaya | 528/170 |

FOREIGN PATENT DOCUMENTS

| | | |
|---|---|---|
| 0311387 | 4/1989 | European Pat. Off. . |
| 0342989 | 11/1989 | European Pat. Off. . |
| 0451405 | 10/1991 | European Pat. Off. . |
| 3-172324 | 7/1991 | Japan . |

*Primary Examiner*—Paul R. Michl
*Attorney, Agent, or Firm*—Burns, Doane, Swecker & Mathis, L.L.P.

[57] ABSTRACT

A polymaleimide resin composition is herein disclosed which comprises an aromatic amino resin, a polymaleimide resin and a bifunctional crosslinking agent as components, and the bifunctional crosslinking agent is selected from the group consisting of an aliphatic diamine compound, a 2,4-diamino-S-triazine compound, a diisocyanate compound, an aliphatic diamine compound and a bismaleimide compound; and a laminate plate for a semiconductor substrate in which the polymaleimide resin composition is used is also disclosed. The thermosetting resin composition permits the preparation of prepregs and green sheets having excellent flexibility, so that the workability and the productivity of the laminate plates can remarkably be improved.

15 Claims, No Drawings

POLYMALEIMIDE RESIN COMPOSITION AND LAMINATE PLATE FOR SEMICONDUCTOR SUBSTRATE USING IT

BACKGROUND OF THE INVENTION (i) Field of the Invention

The present invention relates to a thermosetting resin composition which is excellent in heat resistance, mechanical strength, electrical insulating properties, workability and productivity, and it also relates to a laminate plate for a semiconductor substrate in which the above thermosetting resin composition is used.

(ii) Description of the Prior Art

Heretofore, thermosetting resins having an imide structure are excellent in electrical insulating properties, heat resistance, dimensional stability of molded articles and the like, and therefore they have widely been used.

A thermosetting resin obtained by thermally polymerizing an aromatic bismaleimide alone, which has typically been used is a material having excellent heat resistance, but inconveniently, it is very brittle and poor in flexibility. As a technique for overcoming such drawbacks, it has been attempted to use a thermosetting resin composition comprising an aromatic bismaleimide and an aromatic diamine. For example, a polyaminobismaleimide resin comprising N,N'-4,4'-diphenylmethanebismaleimide and 4,4'-diaminodiphenylmethane (trade name Kelimide, made by Rhone-Poulenc) has been put to practical use, and it has widely been used in varnishes for impregnation, laminate plates, molded articles and the like. In this type of thermosetting resin, however, impact resistance and flexibility are never satisfactory.

On the other hand, ceramics have exclusively been used as semiconductor substrates, but since the ceramics have a high dielectric constant, their electrical response velocity is limited, so that a wiring density cannot be increased, which interferes with the miniaturization and the weight reduction of electronic devices. Thus, the development of semiconductor substrates made of the resins has strongly been desired. However, in the case that the above thermosetting resin composition is used for the preparation of the semiconductor substrates, the storage stability of the varnishes is poor, and the heat stability of the thermally set resin substrates and electric properties such as an inductive tangent are insufficient. Hence, the further improvement of the thermosetting resin composition has strongly been desired.

In order to solve the above problems, the present applicant has already disclosed a thermosetting resin composition comprising a novel polymaleimide resin and a specific aromatic amine resin and a thermally curable resin obtained by using the same in Japanese Patent Application Laid-open No. 172324/1991. As a result of further detailed investigation, however, it has been apparent that prepregs and green sheets (which are the sheets obtained by coating films with a varnish containing a filler, subjecting them to a heat treatment so as to vaporize and remove a solvent, and then peeling) made of this combination material alone are poor in flexibility, and so the operativity of continuously molding and winding the sheet as well as productivity low. Hence, its improvement has strongly been desired. Particularly in the case of the green sheets, a winding performance must be good for a high productivity, but the winding operation has been impossible, because the molding products using the thermosetting resin composition has no flexibility.

SUMMARY OF THE INVENTION

An object of the present invention is to provide a thermosetting resin which can hold excellent heat resistance, mechanical strength and electrical insulating properties and which can impart a good flexibility to obtained prepregs and green sheets.

Another object of the present invention is to provide a resin composition for use in the manufacture of laminate plates for semiconductor substrates.

The present inventors have intensively investigated with the intention of developing a thermosetting resin composition which can maintain excellent heat resistance, mechanical strength and electrical insulating properties and which can impart a good flexibility to formed prepregs and green sheets in order to manufacture laminate plates for IC substrates, and as a result, the present invention has been completed.

That is to say, the present invention is directed to a polymaleimide resin composition which comprises an aromatic amino resin represented by the formula (1), a polymaleimide resin represented by the formula (2) and a bifunctional crosslinking agent:

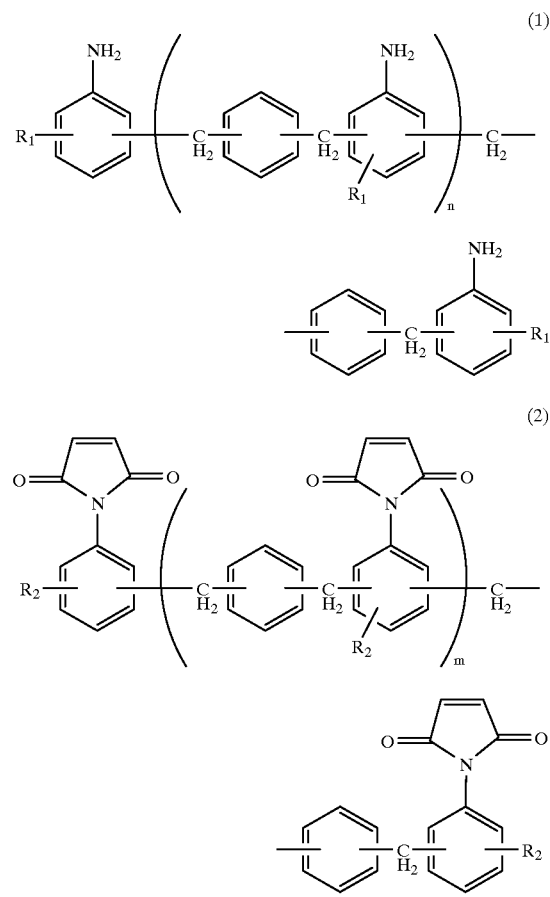

wherein $R_1$ and $R_2$ are each a hydrogen atom, a halogen atom, an alkyl group, an alkoxy group or an aryl group; and n and m are each an integer of 0 to 50.

As the bifunctional crosslinking agent which can be used in the present invention, any agent can be used, so long as it can function as the bifunctional crosslinking agent so as to effectively improve the flexibility of the formed prepregs and green sheets. A first typical example of the bifunctional crosslinking agent is an aliphatic diamine compound, and a second typical example thereof is a 2,4-diamino-S-triazine compound represented by the formula (3)

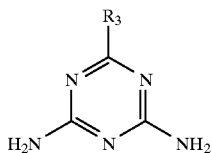

(3)

wherein $R_1$ and $R_2$ are each independently a hydrogen atom, a halogen atom, an alkyl group, an alkoxy group or an aryl group; n and m are each independently an integer of 0 to 50; and $R_3$ is a hydrogen atom, an alkyl group or a phenyl group which may have a substituent.

It is possible to simultaneously use the aliphatic diamine compound and the 2,4-diamino-S-triazine compound, whereby a synergistic effect can be exerted.

A third typical example is the employment of a diisocyanate compound. A fourth typical example is the simultaneous use of a bismaleimide compound and the aliphatic diamine compound.

In the present invention, there can be used a polymaleimide resin composition comprising the aromatic amine resin represented by the formula (1), the polymaleimide resin represented by the formula (2) and the bifunctional crosslinking agent in a weight ratio of 5–100:100:1–30, whereby the above object can be achieved. Additionally, in the case of the fourth typical example in which the bismaleimide is added, the above components are used in a weight ratio of 5–100:100:1–30:5–50.

According to the present invention, there is also provided a varnish solution in which the above polymaleimide resin composition is dissolved in a solvent, and there is further provided a filler dispersing varnish solution in which a filler is dispersed in the varnish solution.

The above varnish solution can be impregnated into a fibrous cloth to form the prepregs, and the filler dispersing varnish solution can be applied onto resin sheets, followed by drying, to provide the green sheets.

Molded articles obtained by laminating and molding a plurality of the above prepregs are useful as the laminate plates for semiconductor substrates, and similarly, molded articles obtained by laminating a plurality of the above green sheets are also useful as the laminate plates for semiconductor substrates. These laminate plates can possess the flexibility which cannot be held in a laminate plate obtained from a conventional polymaleimide resin composition, and in this point, they are extremely characteristic.

DETAILED DESCRIPTION OF THE INVENTION

Next, the present invention will be described in more detail.

A polymaleimide resin composition of the present invention comprises an aromatic amine resin represented by the formula (1), a polymaleimide resin represented by the formula (2) and a bifunctional crosslinking agent as components. In the present invention, the bifunctional crosslinking agent generically means an agent which can carry out a crosslinking reaction with the aromatic amine resin or the polymaleimide resin at 100° C. or less.

In the compounds represented by the general formulae (1) and (2), $R_1$ and $R_2$ are each independently a hydrogen atom, halogen atom, alkyl group, alkoxy group or aryl group. Examples of these compounds preferably include a hydrogen atom, halogen atom (e.g., a fluorine atom, chlorine atom or bromine atom), alkyl groups having 1 to 8 carbon atoms (e.g., a methyl group, ethyl group, n-propyl group, isopropyl group, n-butyl group, isobutyl group, tert-butyl group, n-pentyl group, isopentyl group, neopentyl group, tert-pentyl group, n-hexyl group, cyclohexyl group, n-heptyl group, cyclohexylmethyl group, n-octyl group, tert-octyl group and 2-ethylhexyl group), alkoxy groups having 1 to 8 carbon atoms (e.g., a methoxy group, ethoxy group, n-propoxy group, isopropoxy group, n-butoxy group, isobutoxy group, sec-butoxy group, n-pentyloxy group, neopentyloxy group, n-hexyloxy group, cyclohexyloxy group, n-heptyloxy group, n-octyloxy group and 2-ethylhexyloxy group), aryl groups having 6 to 10 carbon atoms (e.g., a phenyl group, 2-methylphenyl group, 3-methylphenyl group, 4-methylphenyl group, 4-ethylphenyl group, 4-n-propylphenyl group, 4-tert-butylphenyl group, 2-methoxyphenyl group, 4-methoxyphenyl group, 3-ethoxyphenyl group, 3-fluorophenyl group, 1-naphthyl group and 2-naphthyl group). More preferably, examples of these compounds include a hydrogen atom, chlorine atom, alkyl groups having 1 to 6 carbon atoms, alkoxy group having 1 to 6 carbon atoms and aryl groups having 6 to 10 carbon atoms, and most preferably, examples of these compounds include a hydrogen atom, alkyl groups having 1 to 4 carbon atoms, alkoxy group having 1 to 4 carbon atoms and aryl groups having 6 to 10 carbon atoms.

In the polymaleimide resin composition of the present invention, the aromatic amine resin represented by the formula (1) and the polymaleimide resin represented by the formula (2) may be used singly or in the form of a mixture of two or more thereof. Furthermore, in the formulae (1) and (2), n and m are each independently an integer of 0 to 50.

Typical examples of the aliphatic diamine which can be used in the first typical example of the present invention include ethylenediamine, 1,3-diaminopropane, 1,4-diaminobutane, 1,4-diaminohexane, 1,6-diaminohexane, 1,2-diaminocyclohexane, 1,3-diaminocyclohexane, 1,4-diaminocyclohexane, 2,5(2,6)-bis(aminomethyl)bicyclo-[2.2.1]heptane (hereinafter referred to as "NBDA"), α,α'-diamino-o-xylene, α,α'-diamino-m-xylene and α,α'-diamino-p-xylene, but particularly preferable are alicyclic aliphatic diamines.

In the polymaleimide resin composition of the present invention, an aliphatic diamine compound may be singly or in the form of a mixture of two or more thereof.

Furthermore, typical examples of $R_3$ of 2,4-diamino-S-triazine (hereinafter abbreviated to "DAT") compound which can be used in the second typical example of the present invention include a hydrogen atom, alkyl groups such as a methyl group, ethyl group, n-propyl group, isopropyl group, n-butyl group, isobutyl group, n-pentyl group, isopentyl group, tert-pentyl group, n-hexyl group, cycloalkyl group, n-heptyl group, n-octyl group, n-decyl group, n-dodecyl group and 3,5,5-trimethyloctyl group, phenyl group and phenyl groups such as o-, m- and p-methylphenyl groups, o-, m- and p-methoxyphenyl groups, p-ethylphenyl group and m-chlorophenyl group which may have a substituent, an alkyl group or a substituent. Particularly preferable is the phenyl group. In the polymaleimide resin composition of the present invention, the DAT compounds may be used singly or in the form of a mixture of two or more thereof.

Furthermore, typical examples of a diisocyanate compound which can be used in the third typical example of the present invention include alkylene diisocyanate compounds such as ethylene diisocyanate, trimethylene diisocyanate, tetramethylene diisocyanate, hexamethylene diisocyanate, octamethylene diisocyanate, nonamethylene diisocyanate, 2,2'-dimethylpentane diisocyanate, 2,2,4-trimethylhexane diisocyanate, isophorone diisocyanate, bis(isocyanatomethyl)cyclohexane, dicyclohexylmethane diisocyanate, cyclohexane diisocyanate, methylcyclohexane diisocyanate, bis(4-isocyanato-n-butylidene)pentaerythritol, dimer acid diisocyanate, 2,5-bis(isocyanatomethyl)-bicyclo-[2.2.1]heptane, 2,6-bis(isocyanatomethyl)bicyclo-[2.2.1]heptane, alkenylene diisocyanate compounds such as butene diisocyanate and 1,3-butadiene-1,4-diisocyanate, aralkylene diisocyanate compounds such as o-xylene diisocyanate, m-xylene diisocyanate and p-xylene diisocyanate, and aromatic diisocyanate compounds such as phenylene diisocyanate, tolylene diisocyanate, ethylphenylene diisocyanate, isopropylphenylene diisocyanate, dimethylpyenylene diisocyanate, diethylphenylene diisocyanate, diisopropylphenylene diisocyanate, naphthalene diisocyanate, methylnaphthalene diisocyanate, biphenyl diisocyanate, 4,4'-diphenylmethane diisocyanate, 3,3'-dimethylmethane-4,4'-diisocyanate, diphenyl ether diisocyanate and benzophenone diisocyanate.

These diisocyanate compounds may be used singly or in the form of a mixture of two or more thereof. These diisocyanate compounds are on the market, and so they are easily available.

Typical examples of a bismaleimide compound which can be used in the fourth typical example of the present invention include various compounds represented by the following formula:

BMI-1

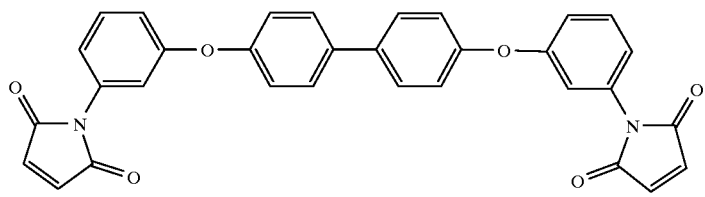

BMI-4

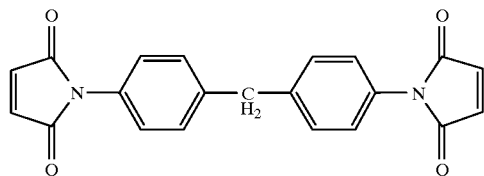

BMI-3

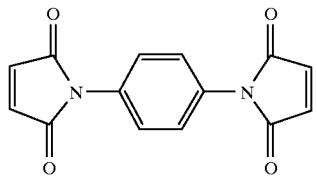

BMI-4

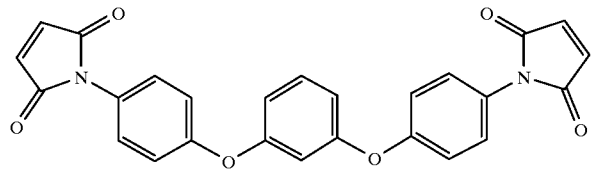

BMI-5

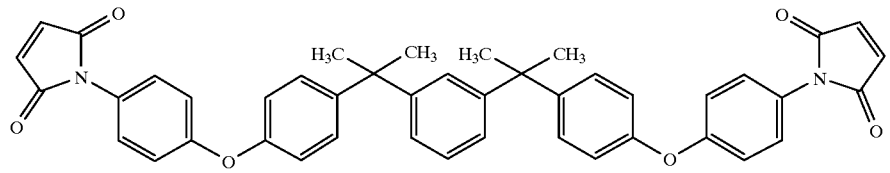

The aromatic amine resin of the formula (1) regarding the present invention can easily be prepared from, for example, aniline and α,α'-dichloro-p-xylene, as disclosed in Japanese Patent Application laid-open Nos. 95125/1989 and 123828/1989 which have previously been filed by the present applicant, and the average molecular weight (MW) of the aromatic amine resin is in the range of about 300 to 10000. Furthermore, the polymaleimide resin of the formula (2) can be prepared by subjecting the aromatic amine resin of the formula (1) and maleic anhydride to dehydration-condensation reaction, as disclosed in Japanese Patent Application laid-open No. 172324/1991 which has previously been filed by the present applicant, and the average molecular weight (MW) of the polymaleimide resin is in the range of about 300 to 10000.

With regard to a blend ratio in the polymaleimide resin composition in the first typical example of the present invention, the aromatic amine resin of the formula (1) is used in a ratio of 5 to 100 parts by weight, preferably 10 to 80 parts by weight, and the aliphatic diamine compound is used in a ratio of 1 to 30 parts by weight, preferably 2 to 15 parts by weight with respect to 100 parts by weight of the polymaleimide resin represented by the formula (2).

If the aromatic amine resin of the formula (1) is less than 5 parts by weight, a cured article is very brittle, so that a satisfactory flexural strength cannot be obtained. On the other hand, if it is more than 100 parts by weight, the heat resistance of the cured article is low. Moreover, if the aliphatic diamine compound is less than 1 part by weight, obtained prepregs and green sheets are poor in flexibility, and if it is more than 30 parts by weight, the storage stability of an obtained varnish is low.

With regard to a blend ratio in the polymaleimide resin composition in the second typical example of the present invention, the aromatic amine resin of the formula (1) is used in a ratio of 5 to 100 parts by weight, preferably 10 to 80 parts by weight, and the DAT compound is used in a ratio of 1 to 30 parts by weight, preferably 2 to 15 parts by weight with respect to 100 parts by weight of the polymaleimide resin represented by the formula (2).

If the aromatic amine resin of the formula (1) is less than 5 parts by weight, a cured article is very brittle, so that a satisfactory flexural strength cannot be obtained. On the other hand, if it is more than 100 parts by weight, the heat resistance of the cured article is low. Moreover, if the DAT compound is less than 1 part by weight, obtained prepregs and green sheets are poor in flexibility, and if it is more than 30 parts by weight, the storage stability of an obtained varnish is low.

With regard to a blend ratio in the polymaleimide resin composition in the third typical example of the present invention, the aromatic amine resin represented by the formula (1) is used in a ratio of 5 to 100 parts by weight, preferably 10 to 80 parts by weight, and the diisocyanate compound is used in a ratio of 1 to 30 parts by weight, preferably 2 to 15 parts by weight with respect to 100 parts by weight of the polymaleimide resin represented by the formula (2).

If the aromatic amine resin of the formula (1) is less than 5 parts by weight, a cured article is very brittle, so that a satisfactory flexural strength cannot be obtained. On the other hand, if it is more than 100 parts by weight, the heat resistance of the cured article is low. Moreover, if the diisocyanate compound is less than 1 part by weight, obtained prepregs and green sheets are poor in flexibility, and if it is more than 30 parts by weight, the storage stability of the obtained varnish is low.

With regard to a blend ratio in the polymaleimide resin composition in the fourth typical example of the present invention, the aromatic amine resin represented by the formula (1) is used in a ratio of 5 to 100 parts by weight, preferably 10 to 80 parts by weight, the bismaleimide compound is used in a ratio of 5 to 50 parts by weight, preferably 10 to 30 parts by weight and the aliphatic diamine compound is used in a ratio of 1 to 30 parts by weight, preferably 2 to 15 parts by weight with respect to 100 parts by weight of the polymaleimide compound represented by the formula (2).

If the aromatic amine resin of the formula (1) is less than 5 parts by weight, a cured article is very brittle, so that a satisfactory flexural strength cannot be obtained. On the other hand, if it is more than 100 parts by weight, the heat resistance of the cured article is low. Moreover, if the bismaleimide compound is less than 5 parts by weight, the heat resistance of the cured resin lowers as much as 10° C. or more, and if it is more than 30 parts by weight, the storage stability of an obtained varnish is low. If the aliphatic diamine compound is less that 1 part by weight, obtained prepregs and green sheets are poor in flexibility, and if it is more than 30 parts by weight, the storage stability of the obtained varnish is low.

If necessary, the following curing promotor, powdery and fibrous fillers and reinforcing materials may be added to the polymaleimide resin composition of the present invention, so long as the objects of the present invention are not impaired.

(a) Examples of the curing promotor include azo compounds, radical polymerization initiators such as organic peroxides, tertiary amines, quaternary ammonium salts, imidazoles and boron trifluoride.amines.

(b) Examples of the powdery or fibrous fillers and reinforcing materials include metal oxides such as aluminum oxide, magnesium oxide and zirconium oxide, metal hydroxides such as aluminum hydroxide, metal carbonates such as calcium carbonate and magnesium carbonate, aluminum titanate, silicon nitride, boron nitride, silicon carbide, tungsten carbide, titanium carbide, cordierite ($2MgO.2Al_2O_3.5SiO_2$), mullite ($3Al_2O_3.2SiO_2$), diatomaceous earth powder, basic magnesium silicate, calcined clay, fine powdery silica, molten silica, crystalline silica, carbon black, kaolin, fine powder mica, quartz powder, graphite, asbestos, molybdenum disulfide, antimony trioxide, glass fiber, rock wool, ceramic fibers, alumina fibers, potassium titanate fibers, carbon fibers and aromatic polyamide fibers.

The above filler can be used in the range of 100 to 600 parts by weight with respect to 100 parts by weight of the resin solid content.

Next, a method for manufacturing laminates for semiconductor substrates will be described.

In the first place, the polymaleimide resin represented by the formula (2), the aromatic amine resin represented by the formula (1) and the bifunctional crosslinking agent can be dissolved in any of the following solvents to obtain a varnish solution. Examples of the usable solvents include acetone, methyl ethyl ketone, methyl isobutyl ketone, diisopropyl ketone, dioxane, digraim, methyl cellosolve, N,N-dimethylformamide, 1,3-dimethyl-2-imidazolidinone, cyclohexanone and N,N-dimethylacetamide. Thus, the varnish solution can be obtained by dissolving the above materials in a single solvent or a mixed solvent thereof with stirring. The solid content (the resin content) in the varnish solution is usually in the range of 30 to 70% by weight. This operation is carried out in the range of −10 to 100° C., preferably 10 to 50° C. Furthermore, if necessary, a curing promotor can be added at the time of this operation.

The thus obtained varnish solution can be impregnated into glass fibrous cloths, carbon fibrous cloths or the like so that a resin content may be in the range of 20 to 100 parts by weight with respect to 100 parts by weight of the cloths, and the cloths are then heated and dried by hot air at 80 to 180° C. to obtain prepregs having a predetermined thickness.

On the other hand, a filler dispersing varnish solution which contains a filler such as aluminum oxide powder or fine powder silica having a particle diameter of 0.5 to 50 $\mu$m in the above ratio can be applied onto carrier films (sheets) of a polyethylene terephthalate or the like so as to obtain a predetermined thickness, and the carrier films are then heated and dried by hot air at 80 to 180° C., followed by peeling, to obtain green sheets. At this time, in order to maintain the sufficient flexibility, the temperature and a drying time are preferably regulated so that 3 to 15% of the solvent may remain therein.

For example, 2 to 100 of the thus obtained prepregs or green sheets having a thickness of 0.05 to 2 mm can be superposed on each other, and then subjected to press work at 180 to 270° C. under a pressure of 10 to 100 kg/cm$^2$ for 1 to 3 hours to mold them, followed by curing at 180 to 270° C., thereby manufacturing a laminate for a semiconductor substrate.

Next, the present invention will be described in more detail in accordance with examples, but needless to say, the scope of the present invention should not be limited to these examples. Incidentally, "part(s)" in the examples means "part(s) by weight".

EXAMPLE 1

30 parts of an aromatic amine resin (average molecular weight Mw=1500) represented by the formula (A) and 100 parts of a polymaleimide resin (average molecular weight Mw=2300) represented by the formula (B)

were dissolved in a mixed solvent of 30 parts of methyl isobutyl ketone (hereinafter referred to as "MIBK") and 90 parts of 1,3-dimethyl-2-imidazolidinone (hereinafter referred to as "DMI") at 90° C. under stirring, followed by if necessary post curing at 180~270° C. for several hours, and cooling the solution to room temperature. Next, 25 parts of an MIBK solution containing 5 parts of NBDA were added dropwise to this solution under vigorous stirring, followed by mixing, to obtain a varnish (hereinafter referred to as "1-V"). After the varnish was allowed to stand for one day at room temperature, the viscosity of the 1-V was 8000 cps, and afterward, the viscosity did not change for one month. Thus, the storage stability of the varnish was extremely excellent.

The 1-V was applied onto a polyethylene terephthalate (PET) film by the use of a YBA type Baker applicator (Yoshimitsu Seiki Co., Ltd.), and it was then dried at 100° C. for 40 minutes to obtain a sheet having a size of 150 mm×150 mm and a thickness of 300 $\mu$m. This sheet was excellent in peeling from a carrier sheet and was so flexible that it could be wound around an aluminum rod having a diameter of 5 mm. In addition, punching and perforating could also easily and successfully be carried out.

Five of the thus obtained sheets were superposed on each other, and they were dried at 150° C. for 10 minutes and successively at 180° C. for 10 minutes in a drying device, and then subjected to press work at 200° C. under a pressure of 50 kg/cm$^2$ for 1 hour and further postcure for 4 hours in an oven at 250° C.

The physical properties of the thus obtained laminate plate were very excellent as follows:

Glass transition temperature (Tg): 290° C.
Dielectric constant: 3.2
Dielectric dissipation factor: 0.003
Flexural strength: 13 kg/cm$^2$
Water absorption: 0.34%
(in water, 25° C., 24 hours)

Here, the Tg was measured by a penetration method using a TMA (a thermo mechanical analyzer), the dielectric constant and the dielectric dissipation factor were measured by JIS K-6911 (frequency=1 MHz), the flexural strength was measured by JIS K-6911, and the water absorption was measured by a gravimetric method (in distilled water, 25° C., 24 hours).

EXAMPLE 2

150 parts of aluminum oxide having an average particle diameter of 2 $\mu$m were added to 100 parts of a varnish (1-V)

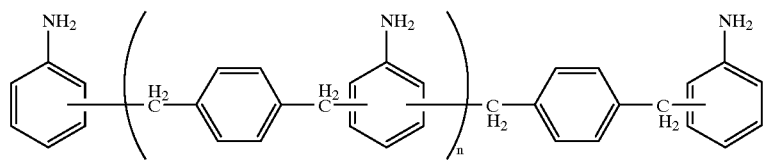

A

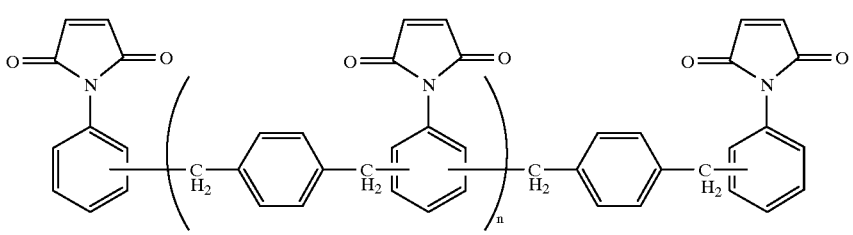

B obtained in Example 1 to obtain a filler dispersing varnish solution (viscosity=20000 cps). This filler dispersing varnish solution was formed into a sheet in the same manner as in Example 1, thereby obtaining a green sheet. This green sheet was very flexible, and it could be wound around an aluminum rod having a diameter of 5 mm. In addition, punching and perforating could also easily and successfully be carried out.

Next, a laminate plate was formed from this green sheet by the same procedure as in Example 1. The physical properties of the thus obtained laminate plate were very excellent as follows:

Glass transition temperature (Tg): 290° C.
Dielectric constant: 3.5
Dielectric dissipation factor: 0.001
Flexural strength: 12 kg/cm$^2$
Water absorption: 0.12%.
(in water, 25° C., 24 hours)

EXAMPLE 3

The same varnish preparation procedure as in Example 1 was conducted except that 2 parts of NBDA were added, thereby obtaining a varnish having a viscosity of 500 cps. This varnish solution was put in an impregnating tank, and a glass cloth (made by Nitto Boseki Co., Ltd.) which had been subjected to an aminosilane treatment was immersed in the varnish solution for 10 seconds. After the cloth was taken out therefrom, the extra varnish was removed by pinch rollers. Incidentally, the selected glass cloth was WF230-100BS6 (trade name) having a thickness of 0.25 mm and a standard weight of 203 g/m$^2$. This glass cloth was air-dried at room temperature for 30 minutes, and further dried at 100° C. for 40 minutes and successively at 130° C. for 10 minutes to obtain a flexible prepreg having a thickness of 500 μm. In addition, punching and perforating could also easily and successfully be carried out. Next, a laminate plate was formed from this prepreg by the same procedure as in Example 1. The physical properties of the thus obtained laminate plate were very excellent as follows:

Glass transition temperature (Tg): 292° C.
Dielectric constant: 4.2
Dielectric dissipation factor: 0.001
Flexural strength: 15 kg/cm$^2$
Water absorption: 0.15%
(in water, 25° C., 24 hours)

EXAMPLE 4

The same procedure as in Example 2 was conducted except that 60 parts of an aromatic amine resin (A) were used, thereby obtaining a varnish, a flexible green sheet and a laminate plate. The physical properties of the thus obtained laminate plate were very excellent as follows:

Glass transition temperature (Tg): 278° C.
Dielectric constant: 3.8
Dielectric dissipation factor: 0.002
Flexural strength: 12 kg/cm$^2$
Water absorption: 0.12%
(in water, 25° C., 24 hours)

EXAMPLE 5

The same procedure as in Example 2 was conducted except that 10 parts of an NBDA were used, thereby obtaining a varnish, a flexible green sheet and a laminate plate. The physical properties of the thus obtained laminate plate were very excellent as follows:

Glass transition temperature (Tg): 282° C.
Dielectric constant: 3.6
Dielectric dissipation factor: 0.002
Flexural strength: 13 kg/cm$^2$
Water absorption: 0.11%
(in water, 25° C., 24 hours)

EXAMPLE 6

The same procedure as in Example 2 was conducted except that an aromatic amine resin (A) having an average molecular weight of 6200 and a polymaleimide resin (B) having an average molecular weight of 8400 were used, thereby obtaining a varnish, a flexible green sheet and a laminate plate. The physical properties of the thus obtained laminate plate were very excellent as follows:

Glass transition temperature (Tg); 298° C.
Dielectric constant: 3.2
Dielectric dissipation factor: 0.001
Flexural strength: 13 kg/cm$^2$
Water absorption: 0.11%
(in water, 25° C., 24 hours)

EXAMPLE 7

The same procedure as in Example 3 was conducted except that an NBDA was replaced with 1,4-diaminocyclohexane, thereby obtaining a varnish, a flexible prepreg and a laminate plate. The physical properties of the thus obtained laminate plate were very excellent as follows:

Glass transition temperature (Tg): 275° C.
Dielectric constant: 4.3
Dielectric dissipation factor: 0.001
Flexural strength: 11 kg/cm$^2$
Water absorption: 0.16%
(in water, 25° C., 24 hours)

EXAMPLE 8

The same procedure as in Example 2 was conducted except that an aromatic amine resin (A) was replaced with an aromatic amine resin (average molecular weight Mw=380) represented by the formula (C)

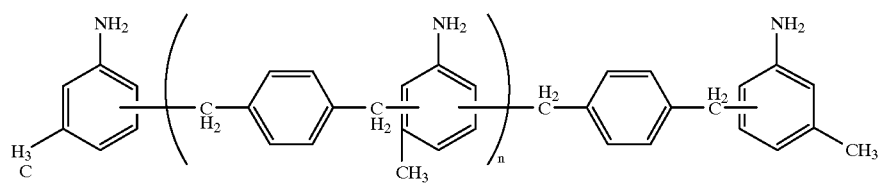

thereby obtaining a varnish, a flexible green sheet and a laminate plate. The physical properties of the thus obtained laminate plate were very excellent as follows:

Glass transition temperature (Tg): 288° C.
Dielectric constant: 3.6
Dielectric dissipation factor: 0.001

Flexural strength: 11 kg/cm²
Water absorption: 0.11%
(in water, 25° C., 24 hours)

EXAMPLE 9

The same procedure as in Example 2 was conducted except that a polymaleimide resin (B) was replaced with a polymaleimide resin (average molecular weight Mw=1050) represented by the formula (D)

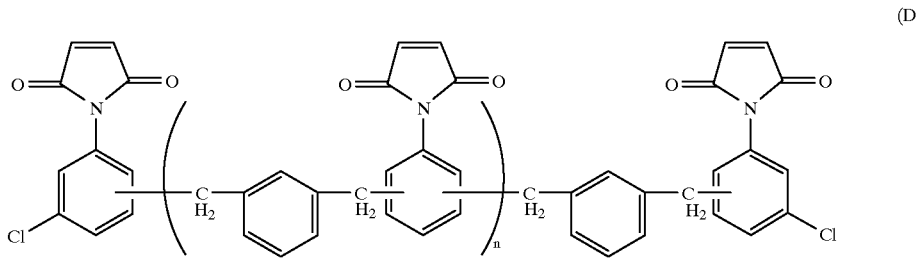

(D)

thereby obtaining a varnish, a flexible green sheet and a laminate plate. The physical properties of the thus obtained laminate plate were very excellent as follows:

Glass transition temperature (Tg): 286° C.
Dielectric constant: 3.8
Dielectric dissipation factor: 0.001
Flexural strength: 13 kg/cm²
Water absorption: 0.10%
(in water, 25° C., 24 hours)

EXAMPLE 10

The same procedure as in Example 2 was conducted except that an aromatic amine resin (A) was replaced with an aromatic amine resin (average molecular weight Mw=850) represented by the formula (E)

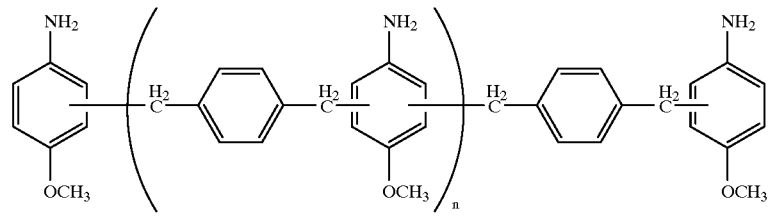

(E)

thereby obtaining a varnish, a flexible green sheet and a laminate plate. The physical properties of the thus obtained laminate plate were very excellent as follows:

Glass transition temperature (Tg): 292° C.
Dielectric constant: 3.7
Dielectric dissipation factor: 0.001
Flexural strength: 12 kg/cm²
Water absorption: 0.13%
(in water, 25° C., 24 hours)

EXAMPLE 11

The same procedure as in Example 2 was conducted except that a polymaleimide resin (B) was replaced with a polymaleimide resin (average molecular weight Mw=1100) represented by the formula (F)

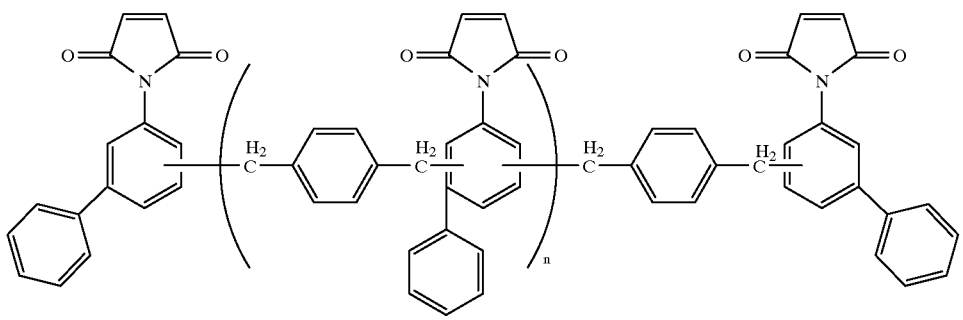

(F)

thereby obtaining a varnish, a flexible green sheet and a laminate plate. The physical properties of the thus obtained laminate plate were very excellent as follows:

Glass transition temperature (Tg): 291° C.
Dielectric constant: 3.6
Dielectric dissipation factor: 0.002
Flexural strength: 11 kg/cm$^2$
Water absorption: 0.12%
(in water, 25° C., 24 hours)

EXAMPLE 12

The same procedure as in Example 2 was conducted except that a polymaleimide resin (B) was replaced with a polymaleimide resin (average molecular weight Mw=4200) represented by the formula (G)

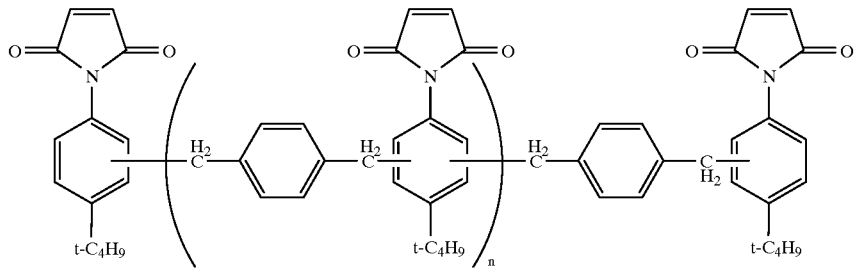

(G)

thereby obtaining a varnish, a flexible green sheet and a laminate plate. The physical properties of the thus obtained laminate plate were very excellent as follows:

Glass transition temperature (Tg): 288° C.
Dielectric constant: 3.6
Dielectric dissipation factor: 0.001
Flexural strength: 12 kg/cm$^2$
Water absorption: 0.11%
(in water, 25° C., 24 hours)

Comparative Example 1

The same procedure as in Example 2 was conducted except that any NBDA was not added, thereby obtaining a varnish and successively a sheet. The obtained sheet was scarcely flexible and was so brittle that the preparation of a laminate plate was extremely difficult, and its yield was 10% or less.

Furthermore, the obtained sheet scarcely had the flexibility, and when it was attempted that the sheet was wound around an aluminum rod having a large diameter of 100 mm, cracks occurred. Thus, while the sheet was in the state of a plate, the formation of the laminate plate was tried, but cracks often took place during the operation of lamination, and its yield was 10% or less. Moreover, the plate obtained somehow by the lamination was post-cured to form a laminate plate, and the physical properties of the obtained laminate plate were about the same as in Example 2, as follows:

Glass transition temperature (Tg): 291° C.
Dielectric constant: 3.5
Dielectric dissipation factor: 0.001
Flexural strength: 11 kg/cm$^2$
Water absorption: 0.13%
(in water, 25° C., 24 hours)

Table 1 summarizes the lamination conditions of the laminate plates formed for the evaluation of the physical properties in Examples 1 to 12 and Comparative Example 1.

TABLE 1

| | Green Sheets or Prepregs | | Thickness of |
|---|---|---|---|
| | Thickness ($\mu$m) | Numbers | Laminate Plate (mm) |
| Example 1 | 304 | 5 | 1.2 |
| Example 2 | 100 | 12 | 1.0 |
| Example 3 | 511 | 4 | 1.6 |
| Example 4 | 502 | 100 | 4.0 |
| Example 5 | 105 | 12 | 1.0 |
| Example 6 | 103 | 12 | 1.0 |

TABLE 1-continued

| | Green Sheets or Prepregs | | Thickness of |
| --- | --- | --- | --- |
| | Thickness ($\mu$m) | Numbers | Laminate Plate (mm) |
| Example 7 | 510 | 4 | 1.6 |
| Example 8 | 302 | 5 | 1.2 |
| Example 9 | 296 | 5 | 1.2 |
| Example 10 | 304 | 5 | 1.2 |
| Example 11 | 301 | 5 | 1.2 |
| Example 12 | 298 | 5 | 1.2 |
| Comp. Ex. 1 | 301 | 5 | 1.2 |

EXAMPLE 13

30 parts of an aromatic amine resin (A) (average molecular weight Mw=1500) represented by the formula (A) and 100 parts of a polymaleimide resin (B) (average molecular weight Mw=2300) represented by the formula (B) were dissolved in a mixed solvent of 30 parts of MIBK and 90 parts of DMI at 90° C. under stirring, followed by cooling the solution to room temperature. Next, 25 parts of an MIBK solution containing 5 parts of a mixture of 2,5-bis(isocyanatomethyl)bicyclo[2.2.1]heptane and 2,6-bis(isocyanatomethyl)bicyclo[2.2.1]heptane in a ratio of 1:1 were added dropwise to this solution under vigorous stirring, followed by mixing, to obtain a varnish ("2-V").

After the varnish was allowed to stand for one day, the viscosity of the 2-V was 2200 cps, and afterward, the viscosity did not change for one month. Thus, the storage stability of the varnish was extremely excellent.

The 2-V was applied onto a polyethylene terephthalate (PET) film by the use of a bar coater, and it was then dried at 100° C. for 40 minutes to obtain a sheet having a size of 150 mm×150 mm and a thickness of 300 $\mu$m. This sheet was excellent in peeling from a carrier sheet and was so flexible that it could be wound around an aluminum rod having a diameter of 5 mm. In addition, punching and perforating could also easily and successfully be carried out. Five of the thus obtained sheets were superposed on each other, and they were dried at 150° C. for 10 minutes and successively at 180° C. for 10 minutes in a drying device, and then subjected to press work at 200° C. under a pressure of 50 kg/cm² for 1 hour and further postcure for 4 hours in an oven at 250° C.

The physical properties of the thus obtained laminate plate were very excellent as follows:
  Glass transition temperature (Tg): 288° C.
  Dielectric constant: 3.4
  Dielectric dissipation factor: 0.003
  Flexural strength: 12 kg/cm²
  Water absorption: 0.44%
  (in water, 25° C., 24 hours)

EXAMPLE 14

150 parts of aluminum oxide having an average particle diameter of 2 $\mu$m were added to 100 parts of a varnish (2-V) obtained in Example 13 to obtain a filler dispersing varnish solution (viscosity=20000 cps). Next, a sheet was formed from this filler dispersing varnish solution in the same manner as in Example 13 to obtain a green sheet. This green sheet was also so flexible that it could be wound around an aluminum rod having a diameter of 5 mm. In addition, punching and perforating could also easily and successfully be carried out.

A laminate plate was formed in accordance with the same procedure as in Example 13 by the use of the above green sheet. The physical properties of the thus obtained tained laminate plate were very excellent as follows:
  Glass transition temperature (Tg): 288° C.
  Dielectric constant: 3.6
  Dielectric dissipation factor: 0.002
  Flexural strength: 12 kg/cm²
  Water absorption: 0.13%
  (in water, 25° C., 24 hours)

EXAMPLE 15

The same varnish preparation procedure as in Example 13 was conducted except that 2 parts of a mixture of 2,5-bis(isocyanatomethyl)bicyclo[2.2.1]heptane and 2,6-bis(isocyanatomethyl)bicyclo[2.2.1]heptane in a ratio of 1:1 were added, thereby obtaining a varnish having a viscosity of 500 cps. This varnish solution was put in an impregnating tank, and a glass cloth (made by Nitto Boseki Co., Ltd.) which had been subjected to an aminosilane treatment was immersed in the varnish solution for 10 seconds. After the cloth was taken out therefrom, the extra varnish was removed by pinch rollers. Incidentally, the selected glass cloth was WF230-100BS6 (trade name) having a thickness of 0.25 mm and a standard weight of 203 g/m². This glass cloth was air-dried at room temperature for 30 minutes, and further dried at 100° C. for 40 minutes and successively at 130° C. for 10 minutes to obtain a flexible prepreg having a thickness of 500 $\mu$m. In addition, punching and perforating could also easily and successfully be carried out. Next, a laminate plate was formed from this prepreg by the same procedure as in Example 13. The physical properties of the thus obtained laminate plate were very excellent as follows:
  Glass transition temperature (Tg): 289° C.
  Dielectric constant: 3.8
  Dielectric dissipation factor: 0.001
  Flexural strength: 14 kg/cm²
  Water absorption: 0.16%
  (in water, 25° C., 24 hours)

EXAMPLE 16

The same procedure as in Example 13 was conducted except that 60 parts of an aromatic amine resin (A) were used, thereby obtaining a varnish. By the use of this varnish, a flexible green sheet and a laminate plate were obtained in the same manner as in Example 14. The physical properties of the thus obtained laminate plate were very excellent as follows:
  Glass transition temperature (Tg): 282° C.
  Dielectric constant: 3.7
  Dielectric dissipation factor: 0.002
  Flexural strength: 14 kg/cm²
  Water absorption: 0.13%
  (in water, 25° C., 24 hours)

EXAMPLE 17

The same procedure as in Example 13 was conducted except that 10 parts of a mixture of 2,5-bis(isocyanatomethyl)bicyclo[2.2.1]heptane and 2,6-bis(isocyanatomethyl)bicyclo[2.2.1]heptane in a ratio of 1:1 were added, thereby obtaining a varnish. By the use of this varnish, a flexible green sheet and a laminate plate were obtained in the same manner as in Example 14. The physical properties of the thus obtained laminate plate were very excellent as follows:

Glass transition temperature (Tg): 282° C.
Dielectric constant: 3.5
Dielectric dissipation factor: 0.002
Flexural strength: 12 kg/cm$^2$
Water absorption: 0.13%
(in water, 25° C., 24 hours)

EXAMPLE 18

The same procedure as in Example 13 was conducted except that an aromatic amine resin (A) having an average molecular weight of 6200 and a polymaleimide resin (B) having an average molecular weight of 8400 were used, thereby obtaining a varnish. By the use of this varnish, a flexible green sheet and a laminate plate were obtained in the same manner as in Example 14. The physical properties of the thus obtained laminate plate were very excellent as follows:

Glass transition temperature (Tg): 292° C.
Dielectric constant: 3.4
Dielectric dissipation factor: 0.002
Flexural strength: 12 kg/cm$^2$
Water absorption: 0.15%
(in water, 25° C., 24 hours)

EXAMPLE 19

The same procedure as in Example 15 was conducted except that a mixture of 2,5-bis(isocyanatomethyl)-bicyclo[2.2.1]heptane and 2,6-bis(isocyanatomethyl)-bicyclo[2.2.1]heptane in a ratio of 1:1 was replaced with tolylene diisocyanate, thereby obtaining a varnish. By the use of this varnish, a flexible prepreg and a laminate plate were similarly obtained. The physical properties of the thus obtained laminate plate were very excellent as follows:

Glass transition temperature (Tg): 290° C.
Dielectric constant: 3.8
Dielectric dissipation factor: 0.002
Flexural strength: 14 kg/cm$^2$
Water absorption: 0.12%
(in water, 25° C., 24 hours)

EXAMPLE 20

The same procedure as in Example 15 was conducted except that an aromatic amine resin (A) was replaced with an aromatic amine resin (C) (average molecular weight Mw=380) represented by the formula (C), thereby obtaining a varnish. By the use of this varnish, a flexible green sheet and a laminate plate were obtained in the same manner as in Example 16. The physical properties of the thus obtained laminate plate were very excellent as follows:

Glass transition temperature (Tg): 286° C.
Dielectric constant: 3.3
Dielectric dissipation factor: 0.002
Flexural strength: 12 kg/cm$^2$
Water absorption: 0.12%
(in water, 25° C., 24 hours)

EXAMPLE 21

The same procedure as in Example 13 was conducted except that a polymaleimide resin (B) was replaced with a polymaleimide resin (D) (average molecular weight Mw=1050) represented by the formula (D), thereby obtaining a varnish. By the use of this varnish, a flexible green sheet and a laminate plate were obtained in the same manner as in Example 14. The physical properties of the thus obtained laminate plate were very excellent as follows:

Glass transition temperature (Tg): 289° C.
Dielectric constant: 3.7
Dielectric dissipation factor: 0.002
Flexural strength: 15 kg/cm$^2$
Water absorption: 0.11%
(in water, 25° C., 24 hours)

EXAMPLE 22

The same procedure as in Example 13 was conducted except that an aromatic amine resin (A) was replaced with an aromatic amine resin (E) (average molecular weight Mw=850) represented by the formula (E), thereby obtaining a varnish. By the use of this varnish, a flexible green sheet and a laminate plate were obtained in the same manner as in Example 14. The physical properties of the thus obtained laminate plate were very excellent as follows:

Glass transition temperature (Tg): 291° C.
Dielectric constant: 3.6
Dielectric dissipation factor: 0.002
Flexural strength: 15 kg/cm$^2$
Water absorption: 0.12%
(in water, 25° C., 24 hours)

EXAMPLE 23

The same procedure as in Example 13 was conducted except that a polymaleimide resin (B) was replaced with a polymaleimide resin (F) (average molecular weight Mw=1100) represented by the formula (F), thereby obtaining a varnish. By the use of this varnish, a flexible green sheet and a laminate plate were obtained in the same manner as in Example 14. The physical properties of the thus obtained laminate plate were very excellent as follows:

Glass transition temperature (Tg): 290° C.
Dielectric constant: 3.4
Dielectric dissipation factor: 0.002
Flexural strength: 15 kg/cm$^2$
Water absorption: 0.16%
(in water, 25° C., 24 hours)

EXAMPLE 24

The same procedure as in Example 13 was conducted except that a polymaleimide resin (B) was replaced with a polymaleimide resin (G) (average molecular weight Mw=4200) represented by the formula (G), thereby obtaining a varnish. By the use of this varnish, a flexible green sheet and a laminate plate were obtained in the same manner as in Example 14. The physical properties of the thus obtained laminate plate were very excellent as follows:

Glass transition temperature (Tg): 288° C.
Dielectric constant: 3.5
Dielectric dissipation factor: 0.002
Flexural strength: 13 kg/cm$^2$
Water absorption: 0.13%
(in water, 25° C., 24 hours)

Table 2 summarizes the lamination conditions of the laminate plates formed for the evaluation of the physical properties in Examples 13 to 24.

TABLE 2

|  | Green Sheets or Prepregs | | Thickness of Laminate Plate (mm) |
|---|---|---|---|
|  | Thickness (μm) | Numbers |  |
| Example 13 | 302 | 5 | 1.2 |
| Example 14 | 104 | 12 | 1.0 |
| Example 15 | 508 | 4 | 1.6 |
| Example 16 | 1005 | 4 | 3.3 |
| Example 17 | 703 | 3 | 1.8 |
| Example 18 | 705 | 3 | 1.8 |
| Example 19 | 501 | 4 | 1.6 |
| Example 20 | 100 | 15 | 1.2 |
| Example 21 | 102 | 15 | 1.2 |
| Example 22 | 104 | 15 | 1.2 |
| Example 23 | 101 | 15 | 1.2 |
| Example 24 | 98 | 15 | 1.2 |

EXAMPLE 25

30 parts of an aromatic amine resin (average molecular weight Mw=1500) represented by the formula (A) and 100 parts of a polymaleimide resin (average molecular weight Mw=2300) represented by the formula (B) were dissolved in a mixed solvent of 30 parts of MIBK and 90 parts of DMI at 90° C. under stirring, followed by cooling the solution to room temperature. Next, 25 parts of an MIBK solution containing 5 parts of 2,4-diamino-6-phenyl-S-triazine represented by the formula (H)

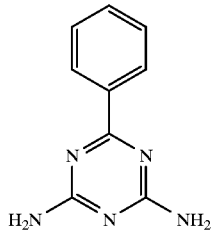

(H)

were added dropwise to this solution under vigorous stirring, followed by mixing, to obtain a varnish ("3-V"). After the varnish was allowed to stand for one day, the viscosity of the 1-V was 8000 cps, and afterward, the viscosity did not change for one month. Thus, the storage stability of the varnish was extremely excellent.

The 1-V was applied onto a polyethylene terephthalate (PET) film by the use of a bar coater, and it was then dried at 100° C. for 40 minutes to obtain a sheet having a size of 150 mm×150 mm and a thickness of 300 μm. This sheet was excellent in peeling from a carrier sheet and was so flexible that it could be wound around an aluminum rod having a diameter of 5 mm. In addition, punching and perforating could also easily and successfully be carried out.

Five of the thus obtained sheets were superposed on each other, and they were dried at 150° C. for 10 minutes and successively at 180° C. for 10 minutes in a drying device, and then subjected to press work at 200° C. under a pressure of 50 kg/cm2 for 1 hour and further postcure for 4 hours in an oven at 250° C.

The physical properties of the thus obtained laminate plate were very excellent as follows:

Glass transition temperature (Tg): 293° C.
Dielectric constant: 3.1
Dielectric dissipation factor: 0.002
Flexural strength: 14 kg/cm$^2$
Water absorption: 0.35%
(in water, 25° C., 24 hours)

EXAMPLE 26

150 parts of aluminum oxide having an average particle diameter of 2 Mm were added to 100 parts of a varnish (3-V) obtained in Example 25 to obtain a filler dispersing varnish solution (viscosity=20000 cps). Next, a sheet was formed from this filler dispersing varnish solution in the same manner as in Example 25 to obtain a green sheet. This green sheet was also so flexible that it could be wound around an aluminum rod having a diameter of 5 mm. In addition, punching and perforating could also easily and successfully be carried out.

A laminate plate was formed in accordance with the same procedure as in Example 25 by the use of the above green sheet. The physical properties of the thus obtained laminate plate were very excellent as follows:

Glass transition temperature (Tg): 293° C.
Dielectric constant: 3.5
Dielectric dissipation factor: 0.001
Flexural strength: 16 kg/cm$^2$
Water absorption: 0.13%
(in water, 25° C., 24 hours)

EXAMPLE 27

The same varnish preparation procedure as in Example 25 was conducted except that 2 parts of a DAT compound represented by the formula (H) were added, thereby obtaining a varnish having a viscosity of 500 cps. This varnish solution was put in an impregnating tank, and a glass cloth (made by Nitto Boseki Co., Ltd.) which had been subjected to an aminosilane treatment was immersed in the varnish solution for 10 seconds. After the cloth was taken out therefrom, the extra varnish was removed by pinch rollers. Incidentally, the selected glass cloth was WF230-100BS6 (trade name) having a thickness of 0.25 mm and a standard weight of 203 g/m$^2$. This glass cloth was air-dried at room temperature for 30 minutes, and further dried at 100° C. for 40 minutes and successively at 130° C. for 10 minutes to obtain a flexible prepreg having a thickness of 500 μm. In addition, the punching and the perforating of this prepreg could also easily and successfully be carried out. Next, a laminate plate was formed from this prepreg by the same procedure as in Example 25. The physical properties of the thus obtained laminate plate were very excellent as follows:

Glass transition temperature (Tg): 293° C.
Dielectric constant: 3.9
Dielectric dissipation factor: 0.001
Flexural strength: 17 kg/cm$^2$
Water absorption: 0.13%
(in water, 25° C., 24 hours)

EXAMPLE 28

The same procedure as in Example 26 was conducted except that 60 parts of an aromatic resin (A) were used, thereby obtaining a varnish, a flexible green sheet and a laminate. The physical properties of the thus obtained laminate plate were very excellent as follows:

Glass transition temperature (Tg): 286° C.
Dielectric constant: 3.7
Dielectric dissipation factor: 0.002
Flexural strength: 15 kg/cm$^2$
Water absorption: 0.11%
(in water, 25° C., 24 hours)

EXAMPLE 29

The same procedure as in Example 26 was conducted except that 10 parts of a DAT compound were used, thereby obtaining a varnish, a flexible green sheet and a laminate. The physical properties of the thus obtained laminate plate were very excellent as follows:

Glass transition temperature (Tg): 284° C.
Dielectric constant: 3.4
Dielectric dissipation factor: 0.001
Flexural strength: 14 kg/cm$^2$
Water absorption: 0.10%
(in water, 25° C., 24 hours)

EXAMPLE 30

The same procedure as in Example 26 was conducted except that an aromatic amine resin (A) having an average molecular weight of 6200 and a polymaleimide resin (B) having an average molecular weight of 8400 were used, thereby obtaining a varnish, a flexible green sheet and a laminate. The physical properties of the thus obtained laminate plate were very excellent as follows:

Glass transition temperature (Tg): 300° C.
Dielectric constant: 3.1
Dielectric dissipation factor: 0.001
Flexural strength: 16 kg/cm$^2$
Water absorption: 0.10%
(in water, 25° C., 24 hours)

EXAMPLE 31

The same procedure as in Example 25 was conducted except that a DAT compound of the formula (H) was replaced with 2,4-diamino-6-methyl-S-triazine represented by the formula (I)

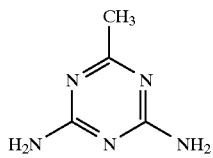

(1)

thereby obtaining a varnish, a flexible prepreg and a laminate. The physical properties of the thus obtained laminate plate were very excellent as follows:

Glass transition temperature (Tg): 285° C.
Dielectric constant: 3.9
Dielectric dissipation factor: 0.001
Flexural strength: 12 kg/cm$^2$
Water absorption: 0.13%
(in water, 25° C., 24 hours)

EXAMPLE 32

The same procedure as in Example 26 was conducted except that an aromatic amine resin (A) was replaced with an aromatic amine resin (average molecular weight Mw=380) represented by the formula (C), thereby obtaining a varnish, a flexible green sheet and a laminate. The physical properties of the thus obtained laminate plate were very excellent as follows:

Glass transition temperature (Tg): 291° C.
Dielectric constant: 3.4
Dielectric dissipation factor: 0.001
Flexural strength: 13 kg/cm$^2$
Water absorption: 0.10%
(in water, 25° C., 24 hours)

EXAMPLE 33

The same procedure as in Example 26 was conducted except that a polymaleimide resin (B) was replaced with a polymaleimide resin (average molecular weight Mw=1050) represented by the formula (D), thereby obtaining a varnish, a flexible green sheet and a laminate. The physical properties of the thus obtained laminate plate were very excellent as follows:

Glass transition temperature (Tg): 287° C.
Dielectric constant: 3.6
Dielectric dissipation factor: 0.001
Flexural strength: 14 kg/cm$^2$
Water absorption: 0.10%
(in water, 25° C., 24 hours)

EXAMPLE 34

The same procedure as in Example 26 was conducted except that an aromatic amine resin (A) was replaced with an aromatic amine resin (average molecular weight Mw=850) represented by the formula (E), thereby obtaining a varnish, a flexible green sheet and a laminate plate. The physical properties of the thus obtained laminate plate were very excellent as follows:

Glass transition temperature (Tg): 292° C.
Dielectric constant: 3.6
Dielectric dissipation factor: 0.001
Flexural strength: 13 kg/cm$^2$
Water absorption: 0.13%
(in water, 25° C., 24 hours)

EXAMPLE 35

The same procedure as in Example 26 was conducted except that a polymaleimide resin (B) was replaced with a polymaleimide resin (average molecular weight Mw=1100) represented by the formula (F), thereby obtaining a varnish, a flexible green sheet and a laminate plate. The physical properties of the thus obtained laminate plate were very excellent as follows:

Glass transition temperature (Tg): 293° C.
Dielectric constant: 3.6
Dielectric dissipation factor: 0.002
Flexural strength: 12 kg/cm$^2$
Water absorption: 0.11%
(in water, 25° C., 24 hours)

EXAMPLE 36

The same procedure as in Example 26 was conducted except that a polymaleimide resin (B) was replaced with a polymaleimide resin (average molecular weight Mw=4200)

represented by the formula (G), thereby obtaining a varnish, a flexible green sheet and a laminate plate. The physical properties of the thus obtained laminate plate were very excellent as follows:

Glass transition temperature (Tg): 288° C.
Dielectric constant: 3.5
Dielectric dissipation factor: 0.001
Flexural strength: 12 kg/cm$^2$
Water absorption: 0.10%
(in water, 25° C., 24 hours)

Table 1 summarizes the lamination conditions of the laminate plates formed for the evaluation of the physical properties in Examples 25 to 36.

TABLE 3

| | Green Sheets or Prepregs | | Thickness of |
| --- | --- | --- | --- |
| | Thickness ($\mu$m) | Numbers | Laminate Plate (mm) |
| Example 25 | 304 | 5 | 1.2 |
| Example 26 | 102 | 12 | 1.0 |
| Example 27 | 510 | 4 | 1.6 |
| Example 28 | 2008 | 2 | 3.3 |
| Example 29 | 1506 | 3 | 3.7 |
| Example 30 | 1504 | 3 | 3.7 |
| Example 31 | 512 | 4 | 1.6 |
| Example 32 | 402 | 4 | 1.3 |
| Example 33 | 402 | 4 | 1.3 |
| Example 34 | 398 | 4 | 1.3 |
| Example 35 | 400 | 4 | 1.3 |
| Example 36 | 403 | 4 | 1.3 |

EXAMPLE 37

30 parts of an aromatic amine resin (A) (average molecular weight Mw=1500) represented by the formula (A), 100 parts of a polymaleimide resin (B) (average molecular weight Mw=2300) represented by the formula (B) and 20 parts of a bismaleimide compound (BMI-1) were dissolved in a mixed solvent of 30 parts of MIBK and 90 parts of dimethylformaldehyde (hereinafter referred to as "DMF") at 90° C. under stirring, followed by cooling the solution to room temperature.

Next, 25 parts of an MIBK solution containing 5 parts of an NBDA were added dropwise to this solution under vigorous stirring, followed by mixing, to obtain a varnish ("4-V"). After the varnish was allowed to stand for one day, the viscosity of the 4-V was 8000 cps, and afterward, the viscosity did not change for one month. Thus, the storage stability of the varnish was extremely excellent.

The 4-V was applied onto a polyethylene terephthalate (PET) film by the use of a bar coater, and it was then dried at 100° C. for 40 minutes to obtain a sheet having a size of 150 mm×150 mm and a thickness of 300 $\mu$m. This sheet was excellent in peeling from a carrier sheet and was so flexible that it could be wound around an aluminum rod having a diameter of 5 mm. In addition, punching and perforating could also easily and successfully be carried out.

Five of the thus obtained sheets were superposed on each other, and they were dried at 150° C. for 10 minutes and successively at 180° C. for 10 minutes in a drying device, and then subjected to press work at 200° C. under a pressure of 50 kg/cm$^2$ for 1 hour and further postcure for 4 hours in an oven at 250° C.

The physical properties of the thus obtained laminate plate were very excellent as follows:

Glass transition temperature (Tg): 301° C.
Dielectric constant: 3.0
Dielectric dissipation factor: 0.003
Flexural strength: 14 kg/cm$^2$
Water absorption: 0.24%
(in water, 25° C., 24 hours)

EXAMPLE 38

150 parts of aluminum oxide having an average particle diameter of 2 $\mu$m were added to 100 parts of a varnish (4-V) obtained in Example 37 to obtain a filler dispersing varnish solution (viscosity=20000 cps). Next, a sheet was formed from this filler dispersing varnish solution in the same manner as in Example 37 to obtain a green sheet. This green sheet was also so flexible that it could be wound around an aluminum rod having a diameter of 5 mm. In addition, punching and perforating could also easily and successfully be carried out.

A laminate plate was formed in accordance with the same procedure as in Example 37 by the use of the above green sheet. The physical properties of the thus obtained laminate plate were very excellent as follows:

Glass transition temperature (Tg): 301° C.
Dielectric constant: 3.4
Dielectric dissipation factor: 0.001
Flexural strength: 15 kg/cm$^2$
Water absorption: 0.13%
(in water, 25° C., 24 hours)

EXAMPLE 39

The same varnish preparation procedure as in Example 37 was conducted except that 40 parts of BMI-1 were added, thereby obtaining a varnish having a viscosity of 500 cps. This varnish solution was put in an impregnating tank, and a glass cloth (made by Nitto Boseki Co., Ltd.) which had been subjected to an aminosilane treatment was immersed in the varnish solution for 10 seconds. After the cloth was taken out therefrom, the extra varnish was removed by pinch rollers. Incidentally, the selected glass cloth was WF230-100BS6 (trade name) having a thickness of 0.25 mm and a standard weight of 203 g/m$^2$. This glass cloth was air-dried at room temperature for 30 minutes, and further dried at 100° C. for 40 minutes and successively at 130° C. for 10 minutes to obtain a flexible prepreg having a thickness of 500 $\mu$m. In addition, the punching and the perforating of this prepreg could also easily and successfully be carried out.

Next, a laminate plate was formed from this prepreg by the same procedure as in Example 37. The physical properties of the thus obtained laminate plate were very excellent as follows:

Glass transition temperature (Tg): 299° C.
Dielectric constant: 3.2
Dielectric dissipation factor: 0.001
Flexural strength: 16 kg/cm$^2$
Water absorption: 0.12%
(in water, 25° C., 24 hours)

EXAMPLE 40

The same procedure as in Example 37 was conducted except that 60 parts of an aromatic amine resin (A) were used, thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 303° C.
Dielectric constant: 3.0
Dielectric dissipation factor: 0.002
Flexural strength: 13 kg/cm$^2$
Water absorption: 0.11%
(in water, 25° C., 24 hours)

EXAMPLE 41

The same procedure as in Example 37 was conducted except that 10 parts of an NBDA were used, thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 300° C.
Dielectric constant: 3.0
Dielectric dissipation factor: 0.001
Flexural strength: 14 kg/cm$^2$
Water absorption: 0.12%
(in water, 25° C., 24 hours)

EXAMPLE 42

The same procedure as in Example 37 was conducted except that an aromatic amine resin (A) having an average molecular weight of 6200 and a polymaleimide resin (B) having an average molecular weight of 8400 were used, thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 308° C.
Dielectric constant: 3.2
Dielectric dissipation factor: 0.001
Flexural strength: 16 kg/cm$^2$
Water absorption: 0.11%
(in water, 25° C., 24 hours)

EXAMPLE 43

The same procedure as in Example 37 was conducted except that an NBDA were replaced with 1,4-diaminocyclohexane, thereby obtaining a varnish. By the use of this varnish, a flexible prepreg and a laminate plate were obtained in the same manner as in Example 39. The physical properties of the thus obtained laminate plate were very excellent as follows:

Glass transition temperature (Tg): 295° C.
Dielectric constant: 3.3
Dielectric dissipation factor: 0.001
Flexural strength: 12 kg/cm$^2$
Water absorption: 0.15%
(in water, 25° C., 24 hours)

EXAMPLE 44

The same procedure as in Example 37 was conducted except that an aromatic amine resin (A) was replaced with an aromatic amine resin (C) (average molecular weight Mw=380) represented by the formula (C), thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 308° C.
Dielectric constant: 3.2
Dielectric dissipation factor: 0.001
Flexural strength: 16 kg/cm$^2$
Water absorption: 0.12%
(in water, 25° C., 24 hours)

EXAMPLE 45

The same procedure as in Example 37 was conducted except that a polymaleimide resin (B) was replaced with a polymaleimide resin (average molecular weight Mw=1050) represented by the formula (D), thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 306° C.
Dielectric constant: 3.7
Dielectric dissipation factor: 0.001
Flexural strength: 15 kg/cm$^2$
Water absorption: 0.11%
(in water, 25° C., 24 hours)

EXAMPLE 46

The same procedure as in Example 37 was conducted except that an aromatic amine resin (A) was replaced with an aromatic amine resin (E) (average molecular weight Mw=850) represented by the formula (E), thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 302° C.
Dielectric constant: 3.2
Dielectric dissipation factor: 0.001
Flexural strength: 14 kg/cm$^2$
Water absorption: 0.12%
(in water, 25° C., 24 hours)

EXAMPLE 47

The same procedure as in Example 38 was conducted except that a polymaleimide resin (B) was replaced with a polymaleimide resin (F) (average molecular weight Mw=1100) represented by the formula (F), thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 302° C.
Dielectric constant: 3.5
Dielectric dissipation factor: 0.001
Flexural strength: 12 kg/cm$^2$
Water absorption: 0.11%
(in water, 25° C., 24 hours)

EXAMPLE 48

The same procedure as in Example 38 was conducted except that a polymaleimide resin (B) was replaced with a polymaleimide resin (G) (average molecular weight Mw=4200) represented by the formula (G), thereby obtaining a varnish. By the use of this varnish, a flexible green sheet and a laminate plate were obtained in the same manner as in Example 38. The physical properties of the thus obtained laminate plate were very excellent as follows:

Glass transition temperature (Tg): 310° C.

Dielectric constant: 3.1

Dielectric dissipation factor: 0.001

Flexural strength: 13 kg/cm²

Water absorption: 0.10%

(in water, 25° C., 24 hours)

Table 4 summarizes the lamination conditions of the laminate plates formed for the evaluation of the physical properties in Examples 37 to 48.

TABLE 4

|  | Green Sheets or Prepregs | | Thickness of Laminate Plate (mm) |
| --- | --- | --- | --- |
|  | Thickness (μm) | Numbers |  |
| Example 37 | 304 | 5 | 1.2 |
| Example 38 | 103 | 12 | 1.0 |
| Example 39 | 508 | 4 | 1.6 |
| Example 40 | 82 | 60 | 4.0 |
| Example 41 | 398 | 5 | 1.6 |
| Example 42 | 403 | 5 | 1.6 |
| Example 43 | 515 | 4 | 1.6 |
| Example 44 | 196 | 7 | 1.2 |
| Example 45 | 200 | 7 | 1.2 |
| Example 46 | 201 | 7 | 1.2 |
| Example 47 | 197 | 7 | 1.2 |
| Example 48 | 203 | 7 | 1.2 |

According to the present invention, there can be provided a thermosetting resin composition which permits the preparation of prepregs and green sheets having excellent flexibility, so that the workability and the productivity of laminate plates can remarkably be improved.

What is claimed is:

1. A polymaleimide resin composition which comprises an aromatic amino resin represented by the formula (1), a polymaleimide resin represented by the formula (2) and a bifunctional crosslinking agent:

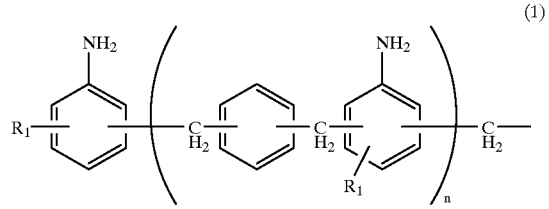

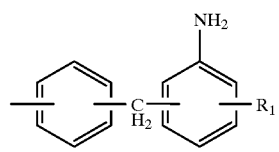

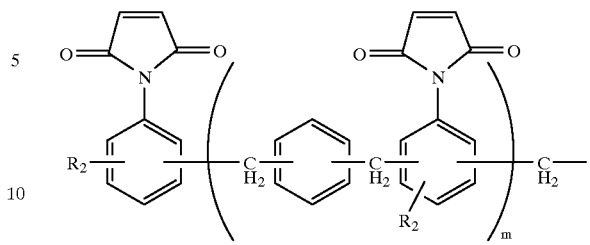

wherein $R_1$ and $R_2$ are each a hydrogen atom, a halogen atom, an alkyl group, an alkoxy group or an aryl group; and n and m are each an integer of 0 to 50;

wherein the bifunctional crosslinking agent is selected from the group consisting of an aliphatic diamine compound, a 2,4-diamino-S-triazine compound and a diisocyanate compound and which comprises the aromatic amine resin represented by the formula (1), the polymaleimide resin represented by the formula (2) and the bifunctional crosslinking agent independently in a weight ratio of 5–100/100/1–30, respectively.

2. The polymaleimide resin composition according to claim 1 wherein the 2,4-diamino-S-triazine compound is represented by the formula (3):

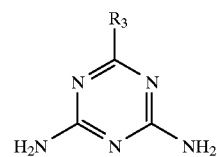

wherein $R_1$ and $R_2$ are each independently a hydrogen atom, a halogen atom, an alkyl group, an alkoxy group or an aryl group; n and m are each independently an integer of 0 to 50; and $R_3$ is a hydrogen atom, an alkyl group or a phenyl group which may have a substituent.

3. The polymaleimide resin composition according to claim 1 wherein the bifunctional crosslinking agent is an aliphatic diamine compound and to which a bismaleimide compound is added and which comprises the aromatic amine resin represented by the formula (1), the polymaleimide resin represented by the formula (2), the aliphatic diamine compound and the bismaleimide compound in a weight ratio of 5–100/100/1–30/5–50, respectively.

4. A varnish solution which is obtained by dissolving the polymaleimide resin composition described in claim 1 in a solvent.

5. A varnish solution which is obtained by dissolving the polymaleimide resin composition described in claim 3 in a solvent.

6. A filler varnish solution which is obtained by dispersing the polymaleimide resin composition described in claim 1 and a filler in a solvent.

7. A filler varnish solution which is obtained by dispersing the polymaleimide resin composition described in claim 3 and a filler in a solvent.

8. A prepreg which is obtained by impregnating the varnish solution described in claim 4 into a fibrous cloth.

9. A prepreg which is obtained by impregnating the varnish solution described in claim 5 into a fibrous cloth.

10. A green sheet which is obtained by applying the filler dispersing varnish solution described in claim 6 onto a resin sheet, drying and then peeling.

11. A green sheet which is obtained by applying the filler dispersing varnish solution described in claim 7 onto a resin sheet, drying and then peeling.

12. A laminate plate for a semiconductor substrate which is obtained by laminating a plurality of the prepregs described in claim 8, and then molding the laminate.

13. A laminate plate for a semiconductor substrate which is obtained by laminating a plurality of the prepregs described in claim 9, and then molding the laminate.

14. A laminate plate for a semiconductor substrate which is obtained by laminating a plurality of the green sheets described in claim 10, and then molding the laminate.

15. A laminate plate for a semiconductor substrate which is obtained by laminating a plurality of the green sheets described in claim 11, and them molding the laminate.

* * * * *

UNITED STATES PATENT AND TRADEMARK OFFICE
CERTIFICATE OF CORRECTION

PATENT NO. : 5,945,503
DATED : August 31, 1999
INVENTOR(S) : Keisuke Takuma et al.

It is certified that error appears in the above-identified patent and that said Letters Patent is hereby corrected as shown below:

Title page,
In accordance with the priority acknowledgment mailed July 30, 1999, the following priority information needs to be added:

-- Japanese Patent Application No. 8-302089
Filed: November 13, 1996

Japanese Patent Application No. 9-093620
Filed: April 11, 1997

Japanese Patent Application No. 9-100211
Filed: April 17, 1997

Japanese Patent Application No. 9-115559
Filed: May 6, 1997 --

Signed and Sealed this

Eighteenth Day of September, 2001

Attest:

*Nicholas P. Godici*

NICHOLAS P. GODICI
*Attesting Officer*   *Acting Director of the United States Patent and Trademark Office*